United States Patent
Ukai et al.

(10) Patent No.: US 11,458,861 B2
(45) Date of Patent: Oct. 4, 2022

(54) VEHICLE CONTROL DEVICE

(71) Applicant: HONDA MOTOR CO., LTD., Tokyo (JP)

(72) Inventors: Hayahito Ukai, Wako (JP); Takehiro Horigome, Wako (JP); Yasuhiro Ikeda, Wako (JP); Satoshi Sekiguchi, Wako (JP); Hironori Deno, Wako (JP); Shota Kawanaka, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 143 days.

(21) Appl. No.: 16/814,075

(22) Filed: Mar. 10, 2020

(65) Prior Publication Data

US 2020/0298727 A1 Sep. 24, 2020

(30) Foreign Application Priority Data

Mar. 18, 2019 (JP) .............................. JP2019-049705

(51) Int. Cl.
*B60L 58/13* (2019.01)
*B60W 60/00* (2020.01)
(Continued)

(52) U.S. Cl.
CPC .............. *B60L 58/13* (2019.02); *B60L 3/0046* (2013.01); *B60L 15/2009* (2013.01);
(Continued)

(58) Field of Classification Search
CPC ........ B60L 3/0046; B60L 58/12; B60L 58/13; B60L 58/14; G01R 31/3647;
(Continued)

(56) References Cited

U.S. PATENT DOCUMENTS

| 2008/0183408 A1* | 7/2008 | Matsuura | ............. | G01R 31/367 702/63 |
| 2010/0052617 A1* | 3/2010 | Aridome | ................. | B60L 58/16 320/132 |

(Continued)

FOREIGN PATENT DOCUMENTS

| CN | 106842049 A | * | 6/2017 |
| JP | 2002-097974 A | | 4/2002 |

(Continued)

OTHER PUBLICATIONS

Japanese Office Action with English Translation dated Jan. 12, 2021, 8 pages.

*Primary Examiner* — David A Testardi
(74) *Attorney, Agent, or Firm* — Rankin, Hill & Clark LLP

(57) ABSTRACT

Provided is a vehicle control device that prevents a specific function of a traveling vehicle from being not able to operate due to a failure of a battery. The vehicle control device includes: a control section configured to execute predetermined function control for a vehicle system; a discharge performance determination section configured to determine whether or not a battery is able to discharge a predetermined amount of current in accordance with a predetermined function before the predetermined function control is started; and an execution availability determination section configured to permit the control section to execute the predetermined function when it is determined that the predetermined amount of current is able to be discharged and inhibit the control section from executing the predetermined function when it is determined that the predetermined amount of current is not able to be discharged.

9 Claims, 8 Drawing Sheets

(51) Int. Cl.
  *B60L 3/00* (2019.01)
  *B60L 15/20* (2006.01)
  *G01R 31/385* (2019.01)
  *G01R 31/36* (2020.01)
  *B60K 6/48* (2007.10)

(52) U.S. Cl.
  CPC ..... *B60W 60/0051* (2020.02); *G01R 31/3647* (2019.01); *G01R 31/385* (2019.01); *B60K 6/48* (2013.01); *B60L 2240/12* (2013.01); *B60L 2240/549* (2013.01); *B60W 2510/244* (2013.01); *B60W 2710/18* (2013.01); *B60Y 2200/92* (2013.01)

(58) Field of Classification Search
  CPC ...... G01R 31/382–3842; G01R 31/386; G01R 31/392; B60R 21/017; B60R 21/0173; H02J 7/005; H01M 10/48; B60W 20/50; B60W 60/0018; B60W 60/005; B60W 60/0053; B60W 20/13; B60W 60/00186; B60W 60/0051
  See application file for complete search history.

(56) References Cited

U.S. PATENT DOCUMENTS

| | | | | |
|---|---|---|---|---|
| 2010/0250194 | A1* | 9/2010 | Newhouse | H01H 47/001 702/183 |
| 2012/0253713 | A1* | 10/2012 | Krajci | G01R 31/388 702/63 |
| 2013/0132011 | A1* | 5/2013 | Mano | H02J 7/0013 702/63 |
| 2015/0120084 | A1* | 4/2015 | List | B60R 21/017 701/1 |
| 2015/0135517 | A1* | 5/2015 | Doi | H01M 10/4285 29/593 |
| 2015/0180040 | A1* | 6/2015 | Sano | H01M 10/06 429/241 |
| 2015/0200424 | A1* | 7/2015 | Ogasawara | H01M 10/12 429/163 |
| 2015/0274027 | A1* | 10/2015 | Crombez | B60L 58/20 701/22 |
| 2015/0293182 | A1* | 10/2015 | Tajima | H02J 7/007188 701/22 |
| 2016/0288648 | A1* | 10/2016 | Klapper | B60L 53/14 |
| 2017/0080819 | A1* | 3/2017 | Larsson | B60W 20/13 |
| 2017/0151880 | A1* | 6/2017 | Nakashima | B60W 20/00 |
| 2017/0259687 | A1* | 9/2017 | Chikkannanavar | B60L 3/0046 |
| 2017/0313313 | A1* | 11/2017 | Asakura | B60W 50/0098 |
| 2018/0134176 | A1* | 5/2018 | Symanow | B60L 58/12 |
| 2018/0334158 | A1* | 11/2018 | Chen | B60W 10/06 |
| 2019/0212391 | A1* | 7/2019 | Koller | G01R 31/367 |
| 2019/0256019 | A1* | 8/2019 | Tezuka | H02J 7/1423 |
| 2019/0386508 | A1* | 12/2019 | Ito | B60W 50/12 |
| 2019/0391577 | A1* | 12/2019 | Uppalapati | B60L 3/12 |
| 2020/0051345 | A1* | 2/2020 | Koller | B60W 50/02 |
| 2020/0153263 | A1* | 5/2020 | Akaishi | H02J 7/0086 |
| 2021/0013554 | A1* | 1/2021 | Proebstle | H02J 7/0048 |
| 2021/0096190 | A1* | 4/2021 | Yoshida | H01M 10/06 |

FOREIGN PATENT DOCUMENTS

| | | | |
|---|---|---|---|
| JP | 2007022196 A | * | 2/2007 |
| JP | 2017-052429 | | 3/2017 |
| JP | 2020-077578 A | | 5/2020 |
| KR | 2011110652 A | * | 10/2011 |
| WO | 2018/078785 A | | 6/2019 |

* cited by examiner

VEHICLE CONTROL DEVICE

INCORPORATION BY REFERENCE

The present application claims priority under 35 U.S.C. § 119 to Japanese Patent Application No. 2019-049705 filed on Mar. 18, 2019. The content of the application is incorporated herein by reference in its entirety.

BACKGROUND OF THE INVENTION

Field of the Invention

The present invention relates to a vehicle control device.

Description of the Related Art

In the related art, an automatic stopping device that automatically stops a traveling vehicle in response to urgency information has been proposed (see Japanese Patent Laid-Open No. 2017-52429, for example).

The aforementioned automatic stopping device determines a degree of urgency in accordance with details of the urgency information and decides a time before the vehicle provided with the automatic stopping device is to be automatically stopped at the time of urgency on the basis of the degree of urgency, peripheral information of the vehicle provided with the automatic stopping device, and information related to a state of the vehicle provided with the automatic stopping device.

In a case in which the traveling vehicle is automatically stopped as a countermeasure at the time of urgency in a manner of the aforementioned automatic stopping device in the related art, it is necessary for power supply from a battery mounted in the vehicle to continue until the vehicle automatically stops. Therefore, there is a disadvantage that if the power supplied from the battery is insufficient due to a failure of the battery, a specific function such as automatic stopping is not able to operate during traveling of the vehicle.

The invention was made in view of the aforementioned background, and an object is to provide a vehicle control device that prevents a specific function of a traveling vehicle from being not able to operate due to a failure of a battery.

SUMMARY OF THE INVENTION

According to an aspect for achieving the aforementioned object, there is provided a vehicle control device that controls operations of a vehicle provided with a battery and a vehicle system using power supplied from the battery and the vehicle control device has a CPU including: a control section configured to execute predetermined function control of causing a predetermined function of the vehicle system to operate; a discharge performance determination section configured to determine whether or not the battery is able to discharge a predetermined amount of current in accordance with the predetermined function before the control section starts the predetermined function control; and an execution availability determination section configured to permit the control section to execute the predetermined function control when the discharge performance determination section determines that the battery is able to discharge the predetermined amount of current and inhibit the control section from executing the predetermined function control when the discharge performance determination section determines that the battery is not able to discharge the predetermined amount of current.

The aforementioned vehicle control device may be configured such that the predetermined function is an automatic driving function, the predetermined amount of current is an amount of current required by the vehicle system to execute vehicle stopping control of causing the vehicle to stop when a predetermined driving stopping condition is satisfied during traveling of the vehicle using automatic driving based on the automatic driving function, and the battery is provided in the vehicle to execute the vehicle stopping control.

The aforementioned vehicle control device may be configured to further the CPU include: a power supply source state recognition section configured to recognize a state of a power supply source that supplies power required to drive the vehicle and may be configured such that as the driving stopping condition, a condition that the power supply source state recognition section recognizes that the power supply source is not able to continue the power supply or a condition that a situation in which the power supply source state recognition section is not able to recognize the state of the power supply source continues for a first determination time or longer is set.

The aforementioned vehicle control device may be configured such that the discharge performance determination section determines whether or not the battery is able to discharge the predetermined amount of current by conducting a discharge test in which the battery is actually caused to discharge.

The aforementioned vehicle control device may be configured such that the execution availability determination section permits the execution of the predetermined function control after the battery is charged until a remaining capacity reaches a first predetermined remaining capacity or more when the discharge performance determination section determines that the battery is able to discharge the predetermined amount of current.

The aforementioned vehicle control device may be configured such that the discharge performance determination section starts to charge the battery up to a second predetermined remaining capacity when the vehicle is activated and starts to determine whether or not the battery is able to discharge the predetermined amount of current after the charging of the battery up to the second predetermined remaining capacity is completed. Here, the first predetermined remaining capacity may be the same as the second predetermined remaining capacity.

The aforementioned vehicle control device may be configured to further the CPU include: a first elapsed time measurement section configured to measure a first elapsed time that is an elapsed time after the discharge performance determination section determines that the battery is able to discharge the predetermined amount of current and may be configured such that the execution availability determination section permits the control section to execute the predetermined function control without causing the discharge performance determination section to determine whether or not the battery is able to discharge the predetermined amount of current when the first elapsed time is less than a second determination time, and determines whether or not to permit the control section to execute the predetermined function control on the basis of a result of causing the discharge performance determination section to determine whether or not the battery is able to discharge the predetermined amount of current when the first elapsed time is equal to or greater than the second determination time.

The aforementioned vehicle control device may be configured to further the CPU include: a stopping vehicle discharge amount measurement section configured to measure a stopping vehicle discharge amount that is an amount of discharge from the battery after a timing at which the vehicle stops when the vehicle stops and may be configured such that the execution availability determination section permits the control section to execute the predetermined function control without causing the discharge performance determination section to determine whether or not the battery is able to discharge the predetermined amount of current when the stopping vehicle discharge amount is less than a determination current amount, and determines whether or not to permit the control section to execute the predetermined function control on the basis of a result of causing the discharge performance determination section to determine whether or not the battery is able to discharge the predetermined amount of current when the stopping vehicle discharge amount is equal to or greater than the determination current amount.

The aforementioned vehicle control device may be configured to further the CPU include: a second elapsed time measurement section configured to measure a second elapsed time that is an elapsed time after a timing at which the vehicle stops when the vehicle stops and may be configured such that the execution availability determination section permits the control section to execute the predetermined function control without causing the discharge performance determination section to determine whether or not the battery is able to discharge the predetermined amount of current when the second elapsed time is less than a third determination time, and determines whether or not to permit the control section to execute the predetermined function control on the basis of a result of causing the discharge performance determination section to determine whether or not the battery is able to discharge the predetermined amount of current when the second elapsed time is equal to or greater than the third determination time.

Here, "stopping of the vehicle" includes not only simple stopping of traveling but also stopping of operations of a control system in the vehicle such as turning-off of an ignition.

The aforementioned vehicle control device may be configured such that the automatic driving is automatic driving in a level that is performed in a state in which a driver of the vehicle releases hands from a steering operation section of the vehicle.

According to the aforementioned vehicle control device, the discharge performance determination section determines that the battery is not able to discharge the predetermined amount of current in a case in which penetration short-circuit, in which both negative and positive pole plates of the battery are short circuited, or the like has occurred due to over-discharge of the battery that accompanies long-term leaving of the vehicle and discharge performance of the battery has been degraded. Also, the execution availability determination section inhibits the control section from executing the predetermined function control. In this manner, it is possible to prevent the predetermined function control from being started in a state in which the predetermined amount of current is not able to be discharged due to a failure of the battery and to prevent the vehicle system that requires supply of the predetermined amount of current from being not able to operate during execution of the predetermined function control.

BRIEF DESCRIPTION OF THE DRAWINGS

DETAILED DESCRIPTION OF THE PREFERRED EMBODIMENTS 1-1. Overall Configuration of Vehicle Control Device Referring to FIGS. 1 and 2, a configuration of a vehicle control device according to an embodiment of the invention will be described. The vehicle control device according to the embodiment includes a control device 1A and a control device 1B provided in a vehicle system 1. The vehicle system 1 controls a vehicle V. FIGS. 1 and 2 illustrate a plan view and a side view of an outline of the vehicle V.

The control device 1A and the control device 1B multiplex a part of functions provided in the vehicle V and make the part redundant, thereby improving reliability of the vehicle system 1. The control device 1A is mainly in charge of automatic driving control and ordinary driving control for manual driving while the control device 1B is mainly in charge of driving assistance control related to risk avoidance and the like.

Figure 2:
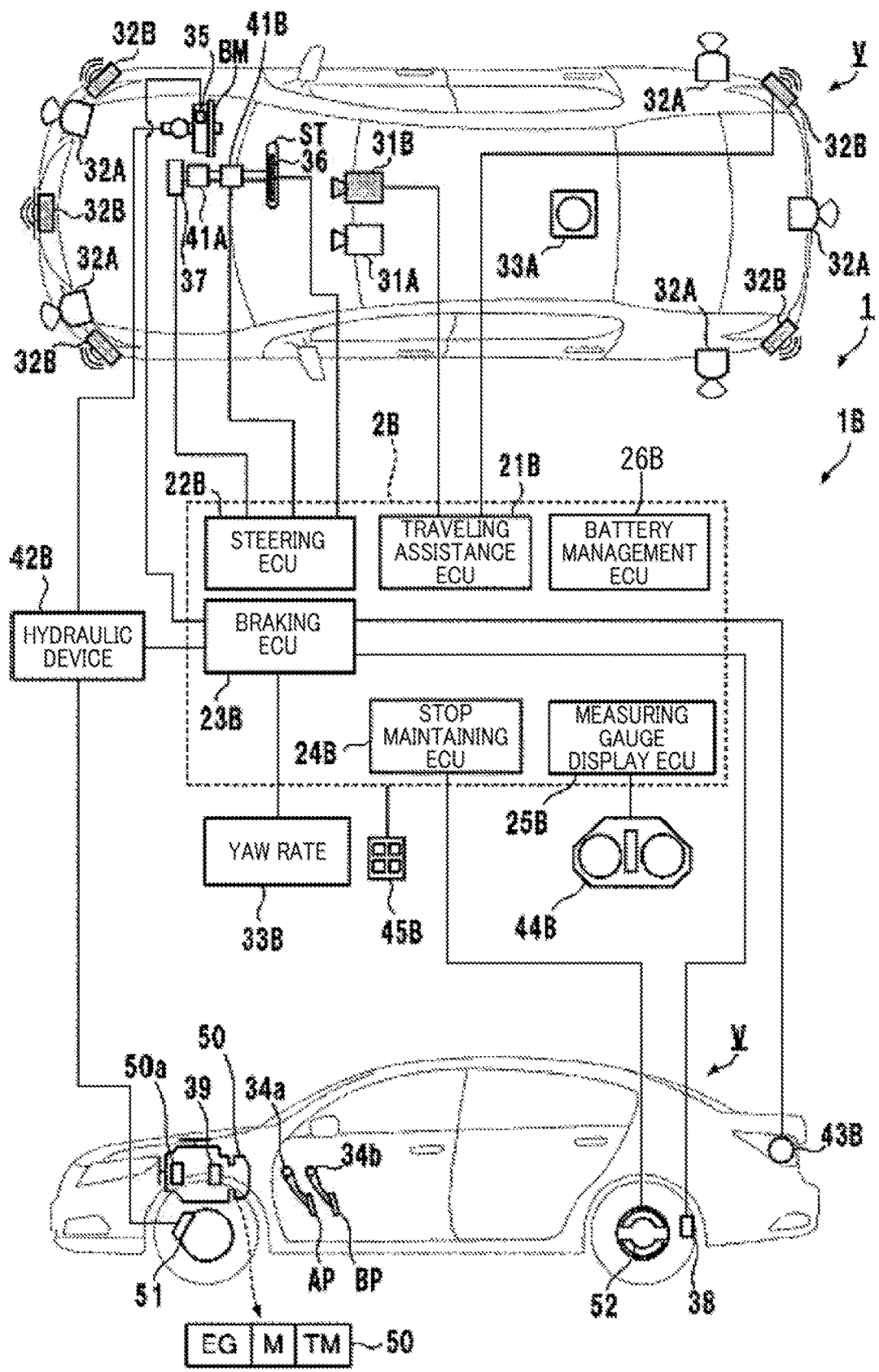
FIG. 2 is a second configuration diagram of the vehicle control device.

The vehicle V according to the embodiment is a hybrid vehicle of a parallel type, and FIG. 2 schematically illustrates a configuration of a power plant 50 configured to output a drive force for causing driving wheels of the vehicle V to rotate. The power plant 50 includes an internal combustion engine EG, a motor M, and an automatic transmission TM. The motor M functions as a drive source configured to cause the vehicle V to travel, and also functions as a generator at the time of deceleration of the vehicle V to perform regenerative braking.

1-2. Control Device 1A

Figure 1:
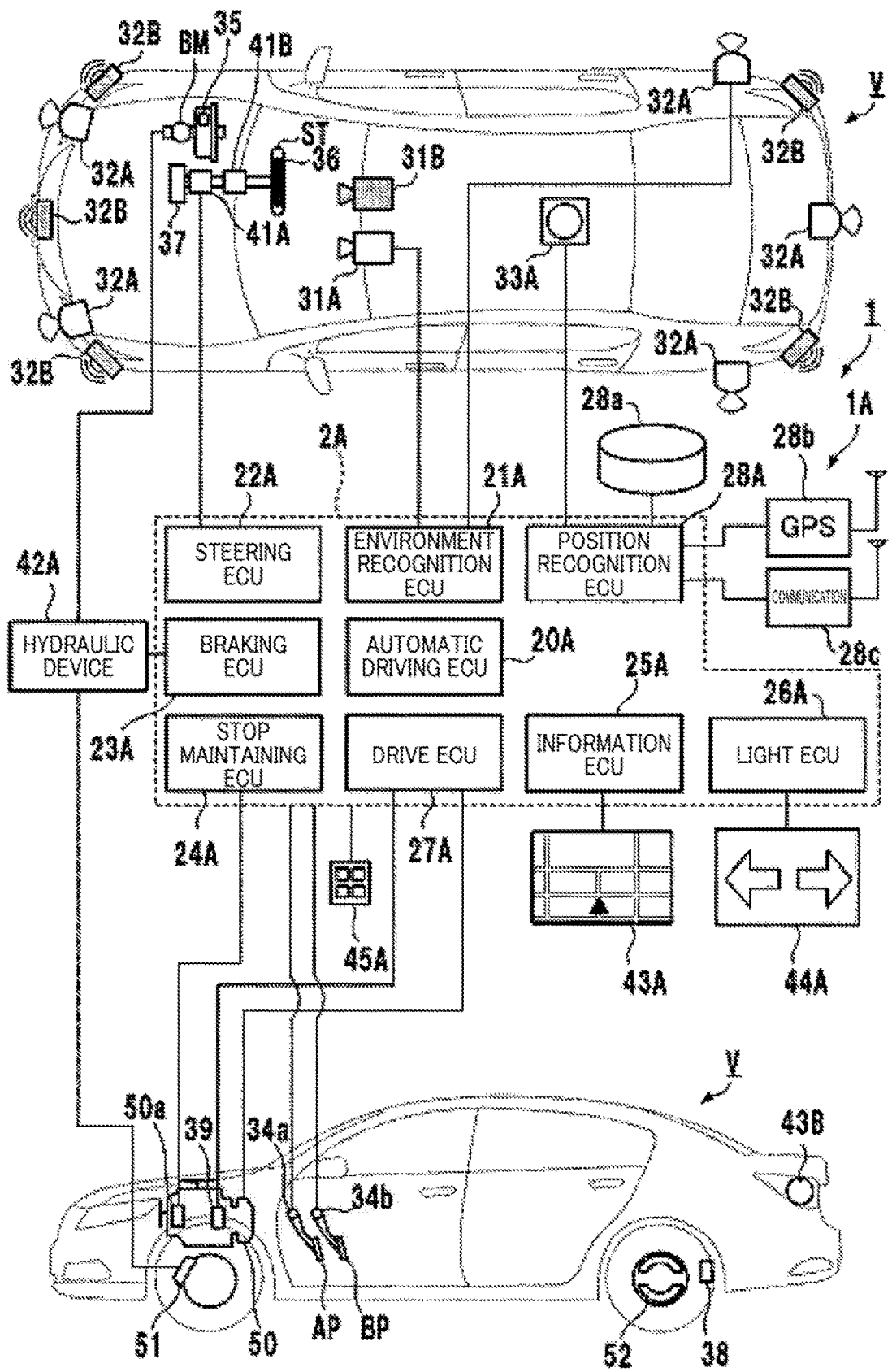
FIG. 1 is a first configuration diagram of a vehicle control device.

Referring to FIG. 1, a configuration of the control device 1A will be described. The control device 1A includes an electronic control unit (ECU) group 2A. The ECU group 2A includes a plurality of ECUs 20A to 28A. Each of the ECUs includes a processor, a representative example of which is a CPU, a storage device such as a semiconductor memory, an interface with an external device, and the like. The storage device stores programs executed by the processor, data used by the processor for processing, and the like. Each of the ECUs may include a plurality of processors, storage devices, interfaces, and the like. Note that the number of the ECUs and functions assigned to the ECUs can appropriately be designed and it is possible to add further division or integration to the embodiment. Note that names of representative functions of the ECUs 20A to 28A are applied in FIGS. 1 and 3. For example, the ECU 20A is illustrated as an "automatic driving ECU".

The ECU 20A executes control related to automatic driving of the vehicle V. In the automatic driving, drive (acceleration of the vehicle V using the power plant 50 and the like), steering, and braking of the vehicle V are automatically performed without requiring operations of the driver. A configuration in which the ECU 20A executes automatic driving control (corresponding to the predetermined function control according to the invention) of causing an automatic driving function (corresponding to the predetermined function according to the invention) of the vehicle system 1 to function corresponds to the control section according to the invention. The ECU 20A executes automatic driving control in a level that is performed in a state in which the driver releases hands from a steering wheel ST (corresponding to the steering operation section according to the invention). Hereinafter, the ECU 20A will also be referred to as an automatic driving unit 20A.

The ECU 21A is an environment recognition unit configured to recognize a traveling environment of the vehicle V on the basis of detection results of detection units 31A and 32A configured to detect a peripheral situation of the vehicle V. In the case of the embodiment, the detection unit 31A is a camera that captures an image in front of the vehicle V (hereinafter, also referred to as a camera 31A) and is provided at a roof front portion of the vehicle V. Through analysis of the image captured by the camera 31A, it is possible to extract outlines of targets and lane markers (white lines and the like) for lanes of roads. In the case of the embodiment, each detection unit 32A is a lidar (laser radar) (hereinafter, also referred to as a lidar 32A), detects targets in the surroundings of the vehicle V, and measures distances to the targets. In the case of the embodiment, five lidars 32A are provided such that one lidar 32A is provided at each corner of a front portion of the vehicle V, one lidar 32A is provided at the center of a rear portion, and one lidar 32A is provided on each side of the rear portion.

The ECU 22A is a steering control unit configured to control an electric power steering device 41A. The electric power steering device 41A includes a mechanism configured to steer front wheels in response to a driving operation (steering operation) performed by the driver on the steering wheel ST. The electric power steering device 41A includes a motor configured to output a drive force for assisting the steering operation or automatically steering the front wheels, a sensor configured to detect the amount of rotation of the motor, a torque sensor configured to detect a steering torque imparted on the driver, and the like.

The ECU 23A is a braking control unit configured to control a hydraulic device 42A. A braking operation performed by the driver on a brake pedal BP is transformed into a liquid pressure by a brake master cylinder BM and is then delivered to the hydraulic device 42A. The hydraulic device 42A is an actuator capable of controlling liquid pressures of hydraulic oil to be supplied to brake devices (for example, disk brake devices) 51 provided at the four respective wheels on the basis of the liquid pressure delivered from the brake master cylinder BM, and the ECU 23A performs drive control for an electromagnetic valve and the like provided in the hydraulic device 42A. In the case of the embodiment, the ECU 23A and the hydraulic device 42A configure an electric servo brake, and the ECU 23A controls distribution of braking forces caused by the four brake devices 51 and a braking force caused through regenerative braking of the motor M, for example.

The ECU 24A is a stop maintaining control unit configured to control an electric parking lock device 50a provided in the automatic transmission TM. The electric parking lock device 50a includes a mechanism configured to lock an internal mechanism of the automatic transmission TM mainly when a P range (parking range) is selected. The ECU 24A can control locking and lock releasing of the electric parking lock device 50a.

The ECU 25A is an intra-vehicle notification control unit configured to control an information output device 43A that provides notifications of information to the inside of the vehicle. The information output device 43A includes a display device, such as a head-up display, and a sound output device, for example. The information output device 43A may further include a vibration device. The ECU 25A causes the information output device 43A to output various kinds of information such as a vehicle speed and an outside air temperature and information such as route guide, for example.

The ECU 26A is an outside-vehicle notification control unit configured to control an information output device 44A that provides notifications of information to the outside of the vehicle. In the case of the embodiment, the information output device 44A is a direction indicator (hazard lamp), and the ECU 26A can provide notifications regarding traveling directions of the vehicle V to the outside of the vehicle by controlling blinking of the information output device 44A that serves as the direction indicator and can attract more attention to the vehicle V from the outside of the vehicle by controlling blinking of the information output device 44A that serves as the hazard lamp.

The ECU 27A is a drive control unit configured to control the power plant 50. Although one ECU 27A is assigned to the power plant 50 in the embodiment, one ECU may be assigned to each of the internal combustion engine EG, the motor M, and the automatic transmission TM. The ECU 27A controls outputs from the internal combustion engine EG and the motor M and switches gears of the automatic transmission TM in accordance with an operation of the driver, a vehicle speed, and the like detected by an operation detection sensor 34a provided at an accelerator pedal AP and an operation detection sensor 34b provided at the brake pedal BP, for example. Note that a rotation frequency sensor 39 configured to detect a rotation frequency of an output shaft of the automatic transmission TM is provided at the automatic transmission TM as a sensor configured to detect a traveling state of the vehicle V. The vehicle speed of the vehicle V can be obtained through an arithmetic operation from a result of the detection performed by the rotation frequency sensor 39.

The ECU 28A is a position recognition unit configured to recognize a current position and a course of the vehicle V. The ECU 28A performs information processing on a result of control and detection or a result of communication of a gyro sensor 33A, a GPS sensor 28b, and a communication device 28c. The gyro sensor 33A detects rotation motion of the vehicle V. It is possible to determine a course of the vehicle V on the basis of a detection result and the like of the gyro sensor 33A. The GPS sensor 28b detects a current position of the vehicle V. The communication device 28c performs wireless communication with a server that provides map information and traffic information and acquires such information. A database 28a can store highly precise map information, and the ECU 28A can more highly precisely specify the position of the vehicle V in a lane on the basis of the map information and the like.

An input device 45A is disposed in the vehicle such that the driver can operate the input device 45A and receives inputs of instructions and information from the driver.

1-3. Control Device 1B

Referring to FIG. 2, a configuration of the control device 1B will be described. The control device 1B includes an ECU group (control unit group) 2B. The ECU group 2B includes a plurality of ECUs 21B to 26B. Each of the ECUs incudes a processor, a representative example of which is a CPU, a storage device such as a semiconductor memory, an interface with an external device, and the like. The storage device stores programs executed by the processor, data used by the processor for processing, and the like. Each of the ECUs may include a plurality of processors, storage devices, interfaces, and the like. Note that the number of the ECUs and functions assigned to the ECUs can appropriately be designed and it is possible to add further division or integration to the embodiment. Note that names of representative functions of the ECUs 21B to 26B are applied in FIGS. 2 and 3 similarly to the ECU group 2A.

The ECU 21B is an environment recognition unit configured to recognize a traveling environment of the vehicle V on the basis of detection results of detection units 31B and 32B configured to detect a peripheral situation of the vehicle V and is also a traveling assistance unit configured to execute control related to traveling assistance (in other words, driving assistance) of the vehicle V. Hereinafter, the ECU 21B will also be referred to as a traveling assistance unit 21B. In the case of the embodiment, the detection unit 31B is a camera that captures an image in front of the vehicle V (hereinafter, also referred to as a camera 31B) and is provided at a roof front portion of the vehicle V. Through analysis of the image captured by the camera 31B, it is possible to extract outlines of targets and lane markers (white lines and the like) for lanes of roads. In the case of the embodiment, each detection unit 32B is a millimeter-wave radar (hereinafter, also referred to as a radar 32B) and detects targets in the surroundings of the vehicle V and measures distances to the targets. In the case of the embodiment, five radars 32B are provided such that one radar 32B is provided at the center of the front portion of the vehicle V, one radar 32B is provided at each corner of the front portion, and one radar 32B is provided at each corner of the rear portion.

As details of the traveling assistance, the ECU 21B can execute control such as collision reducing braking and lane departure curbing, for example. For the collision reducing braking, avoidance of collision is assisted by providing an instruction for operating the brake devices 51 to the ECU 23B, which will be described later, in a case in which there is an increased probability of collision against an obstacle located forward. For the lane departure curbing, lane departure curbing is assisted by providing an instruction for operating an electric power steering device 41B to the ECU 22B, which will be described later, in a case in which there is an increased probability that the vehicle V will depart from a traveling lane.

The ECU 22B is a steering control unit configured to control the electric power steering device 41B. The electric power steering device 41B includes a mechanism configured to steer the front wheels in response to a driving operation (steering operation) performed by the driver on the steering wheel ST. The electric power steering device 41B includes a motor configured to output a drive force for assisting the steering operation or automatically steering the front wheels, a sensor configured to detect the amount of rotation of the motor, a torque sensor configured to detect a steering torque imparted on the driver, and the like. Also, a steering angle sensor 37 is electrically connected to the ECU 22B via a communication line L2, which will be described later, and the ECU 22B can control the electric power steering device 41B on the basis of a detection result of the steering angle sensor 37. The ECU 22B can acquire a detection result of a sensor 36 configured to detect whether or not the driver is gripping the steering wheel ST and can monitor a gripping state of the driver.

The ECU 23B is a braking control unit configured to control a hydraulic device 42B. A braking operation performed by the driver on the brake pedal BP is transformed into a liquid pressure by the brake master cylinder BM and is then delivered to the hydraulic device 42B. The hydraulic device 42B is an actuator capable of controlling liquid pressures of hydraulic oil to be supplied to the brake devices 51 provided at the respective wheels on the basis of the liquid pressure delivered from the brake master cylinder BM, and the ECU 23B performs drive control for an electromagnetic valve and the like provided in the hydraulic device 42B.

In the case of the embodiment, wheel speed sensors 38 provided at the four respective wheels, a yaw rate sensor 33B, and a pressure sensor 35 configured to detect a pressure in the brake master cylinder BM are electrically connected to the ECU 23B and the hydraulic device 42B, and an ABS function, traction control, and a posture control function of the vehicle V are realized on the basis of detection results of the wheel speed sensors 38, the yaw rate sensor 33B, and the pressure sensor 35. For example, the ECU 23B adjusts braking forces of the respective wheels on the basis of the detection result of the wheel speed sensors 38 provided at the four respective wheels and curbs slipping of the respective wheels. Also, the ECU 23B adjusts the braking forces of the respective wheels on the basis of a rotational angular speed of the vehicle V around a vertical axis detected by the yaw rate sensor 33B and curbs a steep change in posture of the vehicle V.

Also, the ECU 23B functions as an outside-vehicle notification control unit configured to control an information output device 43B that provides notifications of information to the outside of the vehicle. In the case of the embodiment, the information output device 43B is a brake lamp, and the ECU 23B can turn on the brake lamp at the time of braking and the like. In this manner, it is possible to attract more attention to the vehicle V from a following vehicle.

The ECU 24B is a stop maintaining control unit configured to control electric parking brake devices (drum brakes, for example) 52 provided at rear wheels. The electric parking brake devices 52 include mechanisms configured to lock the rear wheels. The ECU 24B can control locking and lock releasing of the rear wheels performed by the electric parking brake devices 52.

The ECU 25B is an intra-vehicle notification control unit configured to control an information output device 44B that provides notifications of information to the inside of the vehicle. In the case of the embodiment, the information output device 44B includes a display device disposed in an instrument panel. The ECU 25B can cause the information output device 44B to output various kinds of information such as a vehicle speed and fuel efficiency.

The ECU 26B is a battery management unit configured to determine whether or not discharge performance of a battery 72B (see FIG. 3), which will be described later, is good. The ECU 26B determines whether or not the discharge performance of the battery 72B is good when the vehicle V is activated and inhibits the ECU 20A from executing automatic driving control when the discharge performance of the battery 72B is not good. Hereinafter, the ECU 26B will also be referred to as a battery management unit 26B.

An input device 45B is disposed in the vehicle such that the driver can operate the input device 45B, and receives inputs of instructions and information from the driver.

1-4. Communication Line

Figure 3:
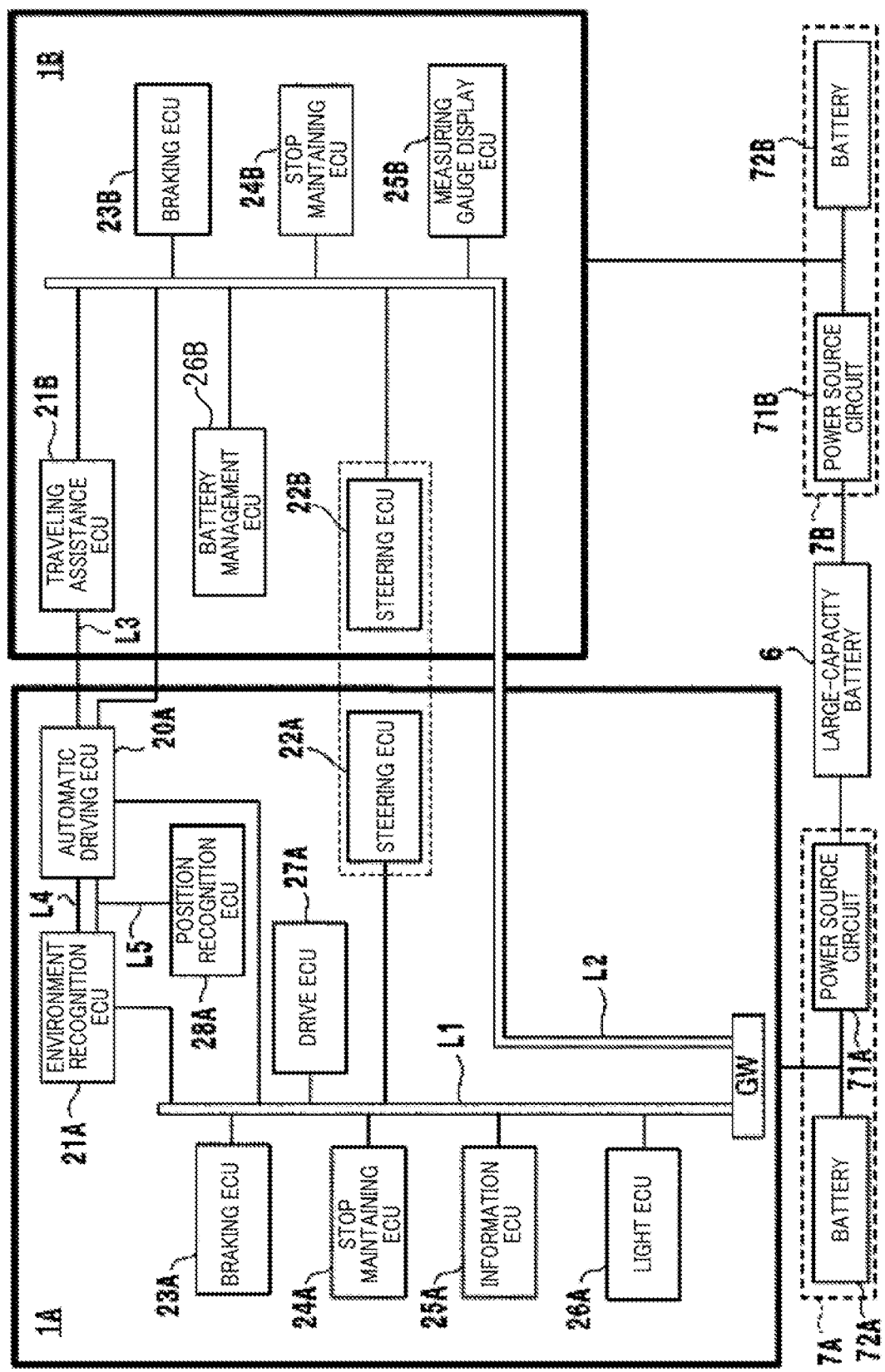
FIG. 3 is a control block of the vehicle control device.

An example of communication lines in the vehicle system 1 that communicably connect the ECUs will be described with reference to FIG. 3. The vehicle system 1 includes wired communication lines L1 to L5. The respective ECUs 20A to 27A of the control device 1A are connected to the communication line L1. Note that the ECU 28A may also be connected to the communication line L1.

The respective ECUs 21B to 26B of the control device 1B are connected to the communication line L2. In addition, the ECU 20A of the control device 1A is also connected to the communication line L2. The communication line L3 connects the ECU 20A and the ECU 21A. The communication line L5 connects the ECU 20A, the ECU 21A, and the ECU 28A.

Although protocols of the communication lines L1 to L5 may be the same or different from each other, the protocols may differently be set in accordance with communication environments such as amounts of communication and durability. For example, the communication lines L3 and L4 may be Ethernet (registered trademark) in terms of communication speeds. For example, the communication lines L1, L2, and L5 may be CAN.

The control device 1A includes a gateway GW. The gateway GW relays the communication line L1 and the communication line L2. Therefore, the ECU 21B can output a control command to the ECU 27A via the communication line L2, the gateway GW, and the communication line L1.

1-5. Power Sources

Power sources of the vehicle system 1 will be described with reference to FIG. 3. The vehicle system 1 includes a large-capacity battery 6, a power source 7A, and a power source 7B. The large-capacity battery 6 is a battery for driving the motor M and is also a battery that is charged by the motor M.

The power source 7A is a power source configured to supply power to the control device 1A and includes a power source circuit 71A and a battery 72A. The power source circuit 71A is a circuit configured to supply electric power from the large-capacity battery 6 to the control device 1A and lowers a voltage (190 V, for example) output from the large-capacity battery 6 to a reference voltage (12 V, for example), for example. The battery 72A is a lead battery of 12 V, for example. By providing the battery 72A, it is possible to supply the power to the control device 1A even in a case in which the power supply from the large-capacity battery 6 and the power source circuit 71A is blocked or reduced.

The power source 7B is a power source configured to supply power to the control device 1B and includes a power source circuit 71B and the battery 72B. The power source circuit 71B is a circuit that is similar to the power source circuit 71A and is a circuit configured to supply power from the large-capacity battery 6 to the control device 1B. The battery 72B is a battery that is similar to the battery 72A and is a lead battery of 12 V, for example. By providing the battery 72B, it is possible to supply power to the control device 1B even in a case in which power supply from the large-capacity battery 6 and the power source circuit 71B is blocked or reduced. The battery 72B corresponds to the battery included in the vehicle in order to execute the vehicle stopping control according to the invention.

2-1. Redundancy

Common functions that the control device 1A and the control device 1B have will be described. It is possible to improve reliability of the vehicle system 1 by making the same functions redundant. In regard to a part of the functions that have been made redundant, completely the same functions are not multiplexed, and different functions are exhibited. This curbs an increase in costs caused by making the functions redundant.

2-2. Actuator System

<Steering>
The control device 1A includes the electric power steering device 41A and the ECU 22A configured to control the electric power steering device 41A. The control device 1B also includes the electric power steering device 41B and the ECU 22B configured to control the electric power steering device 41B.
<Braking>
The control device 1A includes the hydraulic device 42A and the ECU 23A configured to control the hydraulic device 42A. The control device 1B includes the hydraulic device 42B and the ECU 23B configured to control the hydraulic device 42B. All the hydraulic device 42A, the ECU 23A, the hydraulic device 42B, and the ECU 23B can be used for braking of the vehicle V. On the other hand, the braking mechanism of the control device 1A uses, as a main function, distribution of a braking force caused by the brake devices 51 and a braking force caused by the motor M through regenerative braking while the braking mechanism of the control device 1B uses, as a main function, a posture control and the like. Both the braking mechanism of the control device 1A and the braking mechanism of the control device 1B exhibit mutually different functions although the functions are related to braking in common.
<Stop Maintaining>
The control device 1A includes the electric parking lock device 50a and the ECU 24A configured to control the electric parking lock device 50a. The control device 1B includes the electric parking brake devices 52 and the ECU 24B configured to control the electric parking brake devices 52. All the electric parking lock device 50a, the ECU 24A, the electric parking brake devices 52, and the ECU 24B can be used to maintain the stopping of the vehicle V. On the other hand, the electric parking lock device 50a is a device that functions when the P range of the automatic transmission TM is selected while the electric parking brake devices 52 are adapted to lock the rear wheels. Both the electric parking lock device 50a and the electric parking brake devices 52 exhibit mutually different functions although the functions are related to stop maintaining of the vehicle V in common.
<Intra-Vehicle Notification>
The control device 1A includes the information output device 43A and the ECU 25A configured to control the information output device 43A. The control device 1B includes the information output device 44B and the ECU 25B configured to control the information output device 44B. All the information output device 43A, the ECU 25A, the information output device 44B, and the ECU 25B can be used to provide notifications of information to the driver. On the other hand, the information output device 43A is a head-up display, for example, while the information output device 44B is a display device such as a measuring gauge. Both the information output device 43A and the information output device 44B can employ mutually different display devices although the display devices are related to intra-vehicle notifications in common.

<Outside-Vehicle Notification>

The control device 1A includes the information output device 44A and the ECU 26A configured to control the information output device 44A. The control device 1B includes the information output device 43B and the ECU 23B configured to control the information output device 43B. All the information output device 44A, the ECU 26A, the information output device 43B, and the ECU 23B can be used to provide notifications of information to the outside of the vehicle. On the other hand, the information output device 44A is a direction indicator (hazard lamp) while the information output device 43B is a brake lamp. Both the information output device 43A and the information output device 43B exhibit mutually different functions although the functions are related to outside-vehicle notification in common. Note that it is also possible to employ a configuration in which the control device 1B controls the hazard lamp while the control device 1A controls the brake lamp.

<Different Points>

The control device 1A includes the ECU 27A configured to control the power plant 50 while the control device 1B does not include any ECU configured to control the power plant 50. In the case of the embodiment, both the control devices 1A and 1B can perform steering, braking, and stop maintaining alone, and it is possible to reduce the speed and to maintain a stopping state while curbing departure from a lane even in a case in which either the control device 1A or the control device 1B experiences degradation of performance, disconnection from the power source, or disconnection of communication. It is possible to curb an increase in costs by the control device 1B not being provided with any ECU configured to control the power plant 50.

2-3. Sensor System

<Detection of Peripheral Situations>

The control device 1A includes the detection units 31A and 32A. The control device 1B includes the detection units 31B and 32B. All the detection units 31A and 32A and the detection units 31B and 32B can be used to recognize a traveling environment of the vehicle V. On the other hand, the detection unit 32A is a lidar while the detection unit 32B is a radar. The lidar is typically advantageous in detecting shapes. Also, the radar is typically more advantageous than the lidar in terms of costs. By using these sensors with different properties together, it is possible to improve performance to recognize targets and to reduce costs. Both the detection units 31A and 31B are cameras, cameras with different properties may be used. For example, one of the cameras may have a higher resolution than a resolution of the other camera. Also, the cameras may have mutually different image angles.

<Vehicle Speed>

The control device 1A includes the rotation frequency sensor 39. The control device 1B includes the wheel speed sensors 38. Both the rotation frequency sensor 39 and the wheel speed sensors 38 can be used to detect the vehicle speed. On the other hand, the rotation frequency sensor 39 is adapted to detect a rotation speed of the output shaft of the automatic transmission TM while the wheel speed sensors 38 are adapted to detect a rotation speed of the wheels. Both the rotation frequency sensor 39 and the wheel speed sensors 38 are sensors for mutually different detection targets although the rotation frequency sensor 39 and the wheel speed sensors 38 can detect the vehicle speed in common.

<Yaw Rate>

The control device 1A includes the gyro sensor 33A. The control device 1B includes the yaw rate sensor 33B. Both the gyro sensor 33A and the yaw rate sensor 33B can be used to detect an angular speed of the vehicle V around the vertical axis. On the other hand, the gyro sensor 33A is used to determine a course of the vehicle V while the yaw rate sensor 33B is used for posture control and the like of the vehicle V. Both the gyro sensor 33A and the yaw rate sensor 33B are sensors for mutually different purposes of utilization although the gyro sensor 33A and the yaw rate sensor 33B can detect the angular speed of the vehicle V in common.

<Steering Angle and Steering Torque>

The control device 1A includes a sensor configured to detect a rotation amount of a motor of the electric power steering device 41A. The control device 1B can acquire a result of the detection performed by the steering angle sensor 37 without the gateway GW being interposed. Both the sensor configured to detect the rotation amount of the motor and the steering angle sensor 37 can be used to detect a steering angle of the front wheels. The control device 1A can curb an increase in costs by using the sensor configured to detect the rotation amount of the motor of the electric power steering device 41A without additionally providing the steering angle sensor 37. It is a matter of course that the steering angle sensor 37 may additionally be provided at the control device 1A as well, and both or one of the sensor configured to detect the rotation amount of the motor and the steering angle sensor 37 may be made redundant in the electric power steering devices 41A and 41B.

Also, both the control devices 1A and 1B can recognize a steering torque by both the electric power steering devices 41A and 41B including torque sensors.

<Amount of Breaking Operation>

The control device 1A includes the operation detection sensor 34b. The control device 1B includes the pressure sensor 35. Both the operation detection sensor 34b and the pressure sensor 35 can be used to detect the amount of braking operation performed by the driver. On the other hand, the operation detection sensor 34b is used to control distribution of braking forces caused by four brake devices 51 and a braking force caused by the motor M through regenerative braking while the pressure sensor 35 is used for posture control and the like. Both the operation detection sensor 34b and the pressure sensor 35 are sensors for different purposes of utilization although the operation detection sensor 34b and the pressure sensor 35 detect the amount of braking operation in common.

2-4. Power Source

The control device 1A operates using power supplied from the power source 7A, and the control device 1B operates using power supplied from the power source 7B. Since the power is supplied to either the control device 1A or the control device 1B even in a case in which the power supplied from either the power source 7A or the power source 7B is blocked or reduced, it is possible to more reliably secure the power source and thereby to improve reliability of the vehicle system 1. In a case in which the power supplied from the power source 7A is blocked or reduced, it is difficult to perform communication between the ECUs via the gateway GW provided at the control device 1A. However, the ECU 21B in the control device 1B can communicate with the ECUs 22B to 24B and the information output device 44B via the communication line L2.

3. Alternative Control

Figure 4:
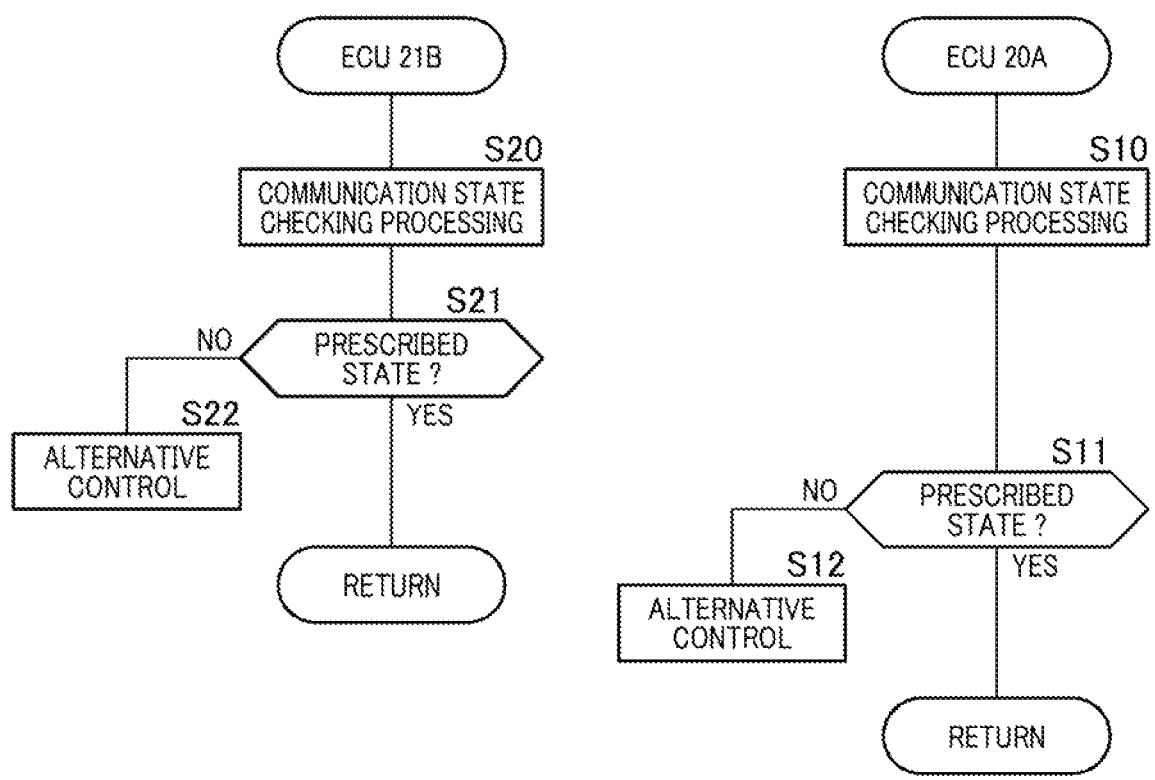
FIG. 4 is a flowchart of processing for switching two control devices.

Next, processing for addressing a case in which degradation of performance or the like of the control device 1A or the control device 1B occurs during automatic driving control will be described. As a result of occurrence of blockage or reduction of power supply from one of the power sources 7A and 7B, for example, degradation of performance or the like of the corresponding one of the control device 1A and the control device 1B may occur. In such a case, alternative control is executed in the embodiment. The alternative control in the embodiment is control for decelerating and stopping the vehicle V. FIG. 4 is a flowchart illustrating an example of processing performed by the ECU 20A and the ECU 21B illustrating the example of the control. The processing in accordance with the flowchart illustrated in FIG. 4 can periodically be performed when an automatic driving mode is set.

The ECU 20A and the ECU 21B perform processing of mutually checking communication states (S10 and S20). For example, one of the ECU 20A and the ECU 21B outputs a response request to the other and determines whether or not there is any response.

The ECU 21B determines whether or not a result of the processing in S20 corresponds to a prescribed state (corresponding to the driving stopping condition according to the invention) in S21 during traveling of the vehicle V using automatic driving. In the case of the prescribed state, it is determined that no degradation of performance and the like of the ECU 20A have occurred, and the processing is ended. In a case in which the result of the processing in S20 does not correspond to the prescribed state, the processing proceeds to S22 to perform the alternative control. The alternative control may be traveling control that leads to higher safety of the vehicle V than usual and may be, for example, deceleration, slow traveling, deceleration and stop, or evacuation to a predetermined region. The alternative control in the embodiment is control for decelerating and stopping the vehicle V. The ECU 21B provides an instruction for a notification to the ECU 24B and causes the information output device 44B to display that the vehicle V will be decelerated and stopped to provide a notification to the driver. Also, the ECU 21B provides an instruction for a notification to the ECU 23B and causes the brake lamp 43B to be turned on or blink to attract attention from the following vehicle.

Then, the ECU 21B provides an instruction for braking to the ECU 23B and decelerates the vehicle V. At the time, the ECU 21B provides an instruction for steering to the ECU 22B in order for the vehicle V not to depart from the lane, on the basis of results of detection performed by the detection units 31B and 32B. The ECU 21B makes determination regarding stopping of the vehicle V from a result of detection performed by the wheel speed sensors 38, and if it is determined that the vehicle V has stopped, the ECU 21B provides an instruction for operating the electric parking brake devices 52 to the ECU 24B and maintains the stopping of the vehicle V.

The ECU 20A determines whether or not a result of the processing in S10 corresponds to a prescribed state in S11. In a case of the prescribed state, it is determined that no degradation of performance and the like of the ECU 21B have occurred, and the processing is ended. In a case in which the result of the processing in S10 does not correspond to the prescribed state, the processing proceeds to S12 to perform the alternative control. Even in a case in which degradation of performance and the like of the control device 1B have occurred, the control device 1A can continue the automatic driving control. However, alternative control is performed in a case in which there is a probability of degradation of performance and the like of the control device 1B on the assumption of a case in which degradation of performance and the like of the control device 1A may occur later. The alternative control described herein is similar to the alternative control in S22 and is control for decelerating and stopping the vehicle V. However, different devices are used.

The ECU 20A provides an instruction for a notification to the ECU 25A and causes the information output device 43A to output that the vehicle V will be decelerated and stopped to notify the driver. Also, the ECU 20A provides an instruction for a notification to the ECU 26A and causes the information output device 44A to blink (hazard lamp) to attract attention from the following vehicle. Then, the ECU 20A provides an instruction for braking to the ECU 23A and decelerates the vehicle V. At the time, the ECU 20A provides an instruction for steering to the ECU 22A in order for the vehicle V not to depart from the lane on the basis of results of detection performed by the detection units 31A and 32A. The ECU 20A makes determination regarding stopping of the vehicle V from a result of detection performed by the rotation frequency sensor 39, and if it is determined that the vehicle V has stopped, the ECU 20A provides an instruction for operating the electric parking lock device 50a to the ECU 24A and maintains the stopping of the vehicle V. As described above, both the control devices 1A and 1B can execute similar alternative control.

Note that the alternative control may be control including switching at least a part of vehicle control performed in the prescribed state into other control. Also, the alternative control may be control using, as a control device and an actuator, a control device and an actuator that are different from the control device and the actuator used in the prescribed state. Also, the alterative control may be control with an amount of control that is different from an amount of control performed in the prescribed state although the control device and the actuator that are similar to the control device and the actuator used in the prescribed state are used. Also, the alternative control may be control in which control that is not performed in the prescribed state is added.

As a representative example of the alternative control, control for decelerating the vehicle and stopping the vehicle as in the embodiment is exemplified. As another example of the alternative control, control for maintaining traveling at a lower speed than a speed in the prescribed state may also be performed. The alternative control may be adapted to perform deceleration in order to curb approaching and contact with obstacles and a foregoing vehicle. The alternative control may include at least one of various kinds of control, such as maintaining of a lane through steering control, curbing of departure of the vehicle to outside a road, performing of steering control to avoid obstacles, a foregoing vehicle, and a following vehicle, pulling over of the vehicle, and changing a vehicle position in a lane (a position in a width direction).

In a case in which the alternative control is being performed, a notification that the alternative control is being performed may be provided to other vehicles in the periphery using the hazard lamp or another display means as in the embodiment, or other vehicles and other terminal devices may be notified through a communication means.

In the example of FIG. 4, the ECU 21B controls the respective devices in the control device 1B in the alternative control in S22. Here, there is a case in which devices other than the ECU 20A in the control device 1A have not cause any degradation of performance and the like and can operate and be used even in a case in which it is determined that result of the processing in S20 does not correspond to the prescribed state in S21. Therefore, the ECU 21B may control at least any of the ECU 22A to 26A in the control device 1A to execute the alternative control in the alternative control in S22. Similarly, the ECU 20A may control at least any of the ECU 22B to 25B in the control device 1B to execute the alternative control in the alternative control in S12.

In the case in which the ECU 20A in the control device 1A uses the respective devices in the control device 1B or the case in which the ECU 21B in the control device 1B uses the respective devices in the control device 1A in this manner, it is preferable to constantly check whether or not degradation of performance and the like have occurred in the respective ECUs. Thus, the ECU 20A may perform processing of checking states of the respective ECUs 21A to 28A in the control device 1A through communication, for example. For example, the ECU 20A may transmit response request signals to the respective ECUs 21A to 28A and check whether or not degradation of performance and the like have occurred in the respective ECUs on the basis of whether or not there have been any responses from the respective ECUs 21A to 28A and details of the responses. The processing may be performed when communication is performed for vehicle control or may periodically be performed. A notification regarding results of the responses may be provided to the ECU 21B.

Similarly, the ECU 21B may perform processing of checking mutual communication states with the respective ECUs 22B to 26B in the control device 1B. For example, the ECU 21B may transmit response request signals to the respective ECUs 22B to 25B and check whether or not degradation of performance and the like have occurred in the respective ECUs on the basis of whether or not there have been any responses from the respective ECUs 22B to 25B and details of the responses. The processing may be performed when communication is performed for vehicle control or may periodically be performed. A notification regarding results of the responses may be provided to the ECU 20A.

In addition, the ECU 20A may perform the processing of checking states of the respective ECUs 22B to 26B in the control device 1B through communication, and similarly, the ECU 21B may perform the processing of checking states of the respective ECUs 21A to 28A in the control device 1A through communication.

4-1. Determination Regarding Discharge Performance of Battery

Next, determination regarding discharge performance of the battery 72B executed by the battery management unit 26B and processing of inhibiting automatic driving based on a result of the determination will be described with reference to FIGS. 5 to 8. As described above, if it is determined that the automatic driving unit 20A is not in the prescribed state during automatic driving, the traveling assistance unit 21B executes alternative control, and control (vehicle stopping control) for decelerating and stopping the vehicle V is executed.

The execution of the vehicle stopping control requires, as assumption, availability of discharge of a predetermined amount of current, which is required to execute the vehicle stopping control, from the battery 72B to the ECU 21B. However, discharge performance of the battery 72B may be degraded in a case in which the vehicle V is not used for a long period of time due to occurrence of penetration short-circuit, in which both positive and negative pole plates of the battery 72B are short-circuited due to over-discharge.

Figure 5:
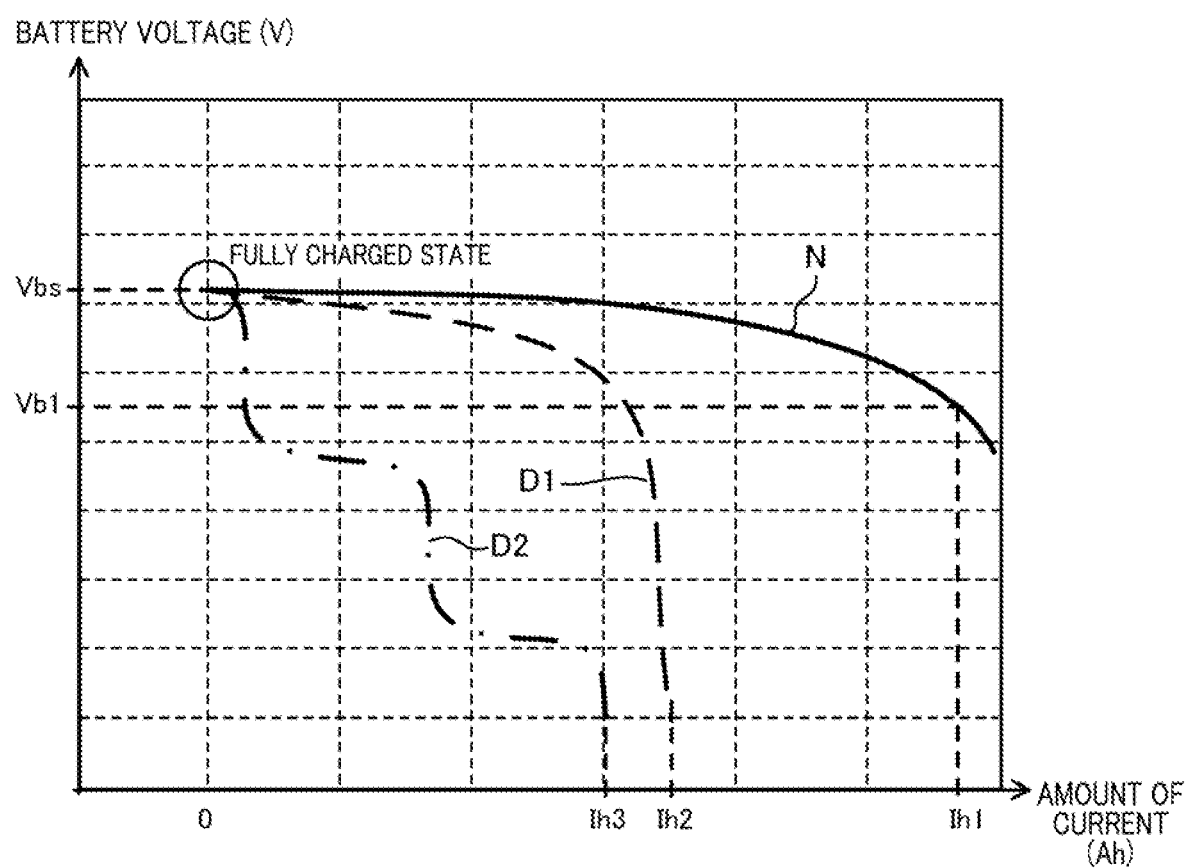
FIG. 5 is a configuration diagram of a battery management unit.

FIG. 5 explains an example in which the discharge performance of the battery is degraded due to penetration short-circuit, where the vertical axis is set for a voltage (V) between terminals of the battery and the horizontal axis is set for the amount of current (Ah) discharged from the battery. In FIG. 5, N represents transition of the amount of discharge in a case in which a normal product with non-degraded discharge performance is discharged from a fully charged state, and the amount of current discharged until the voltage between the terminals reaches $Vb1$ from $Vbs$ is $Ih1$.

On the other hand, D1 and D2 represent transition of the amounts of discharge in a case in which degraded products with discharge performance degraded due to penetration short-circuit are discharged from the fully charged state. D1 indicates that the amount of current discharged is only $Ih2$, D2 indicates that the amount of current discharged is only $Ih3$, and the amounts of current that can be supplied are significantly reduced as compared with the normal product. If the automatic driving of the vehicle V is started in a state in which such degradation of the discharge performance has occurred in the battery 72B, there is a concern that it is not possible to execute the vehicle stopping control in a case in which it is necessary to perform the aforementioned alternative control. Thus, the battery management unit 26B makes determination regarding the discharge performance of the battery 72B when the vehicle V is activated.

4-2. Configuration of Battery Management Unit

Figure 6:
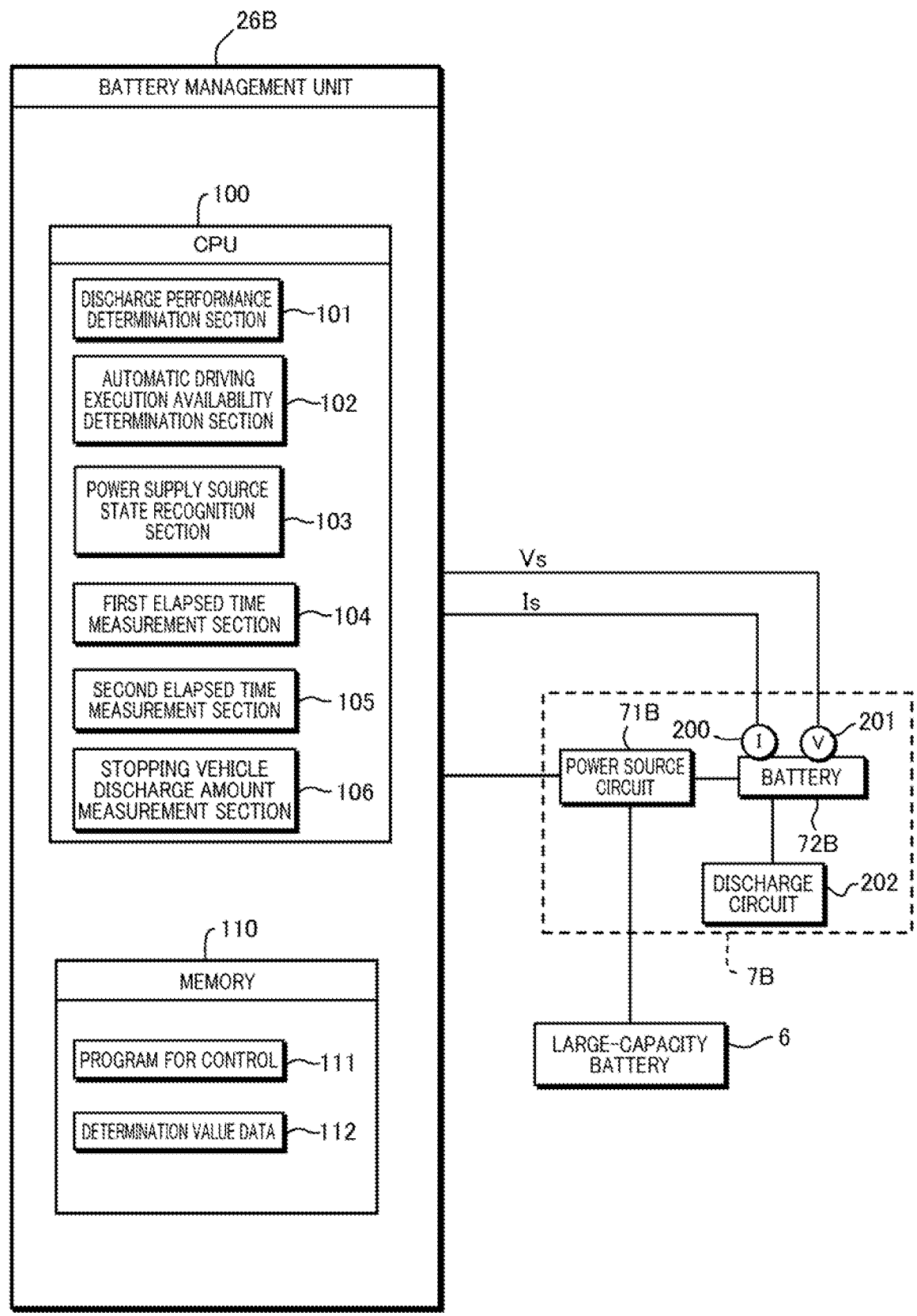
FIG. 6 is an explanatory diagram of degradation of discharge performance of a battery.

Referring to FIG. 6, the battery management ECU 26B is an electronic circuit unit configured to include a CPU 100, a memory 110, and the like. The memory 110 saves a program 111 for controlling the battery management ECU 26B, various kinds of determination value data 112, and the like.

The CPU 100 functions as a discharge performance determination section 101, an automatic driving execution availability determination section 102, a power supply source state recognition section 103, a first elapsed time measurement section 104, a second elapsed time measurement section 105, and a stopping vehicle discharge amount measurement section 106 by reading and executing the program 111 for control saved in the memory 110.

Figure 7:
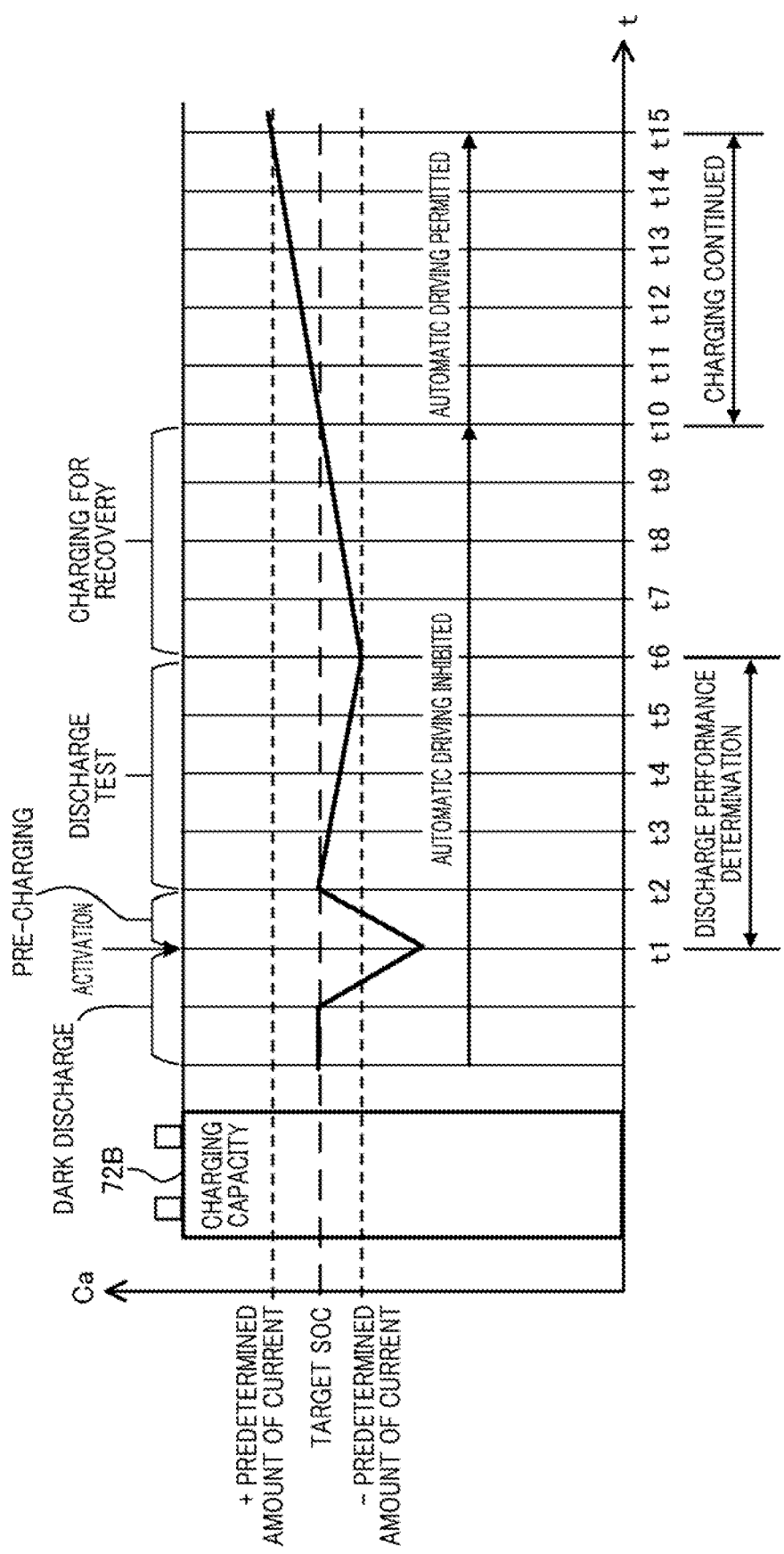
FIG. 7 is an explanatory diagram of determination of the discharge performance of the battery that is executed when a vehicle is activated.

The discharge performance determination section 101 conducts a discharge test in which the battery 72B is actually caused to discharge and determines whether or not the battery 72B can discharge a predetermined amount of current (hereinafter, referred to as a discharge performance determination) in accordance with the sequence illustrated in FIG. 7 before the automatic driving control is started. The predetermined amount of current is set to an amount of current required to execute the driving stopping control. FIG. 7 illustrates transition of a remaining capacity of the battery 72B, where the vertical axis is set to a remaining capacity Ca of the battery 72B and the horizontal axis is set to a time t.

The power source 7B includes a current sensor 200 configured to detect a discharged current and a charged current of the battery 72B, a voltage sensor 201 configured to detect the voltage between the terminals of the battery 72B, and a discharge circuit 202 configured to perform discharge from the battery 72B.

The discharge performance determination section 101 starts processing of discharge performance determination for the battery 72B when the vehicle V is activated at t1. The discharge performance determination section 101 charges the battery 72B up to a target state of charge (SOC) with the power source circuit 71B (pre-charging) at t1 to t2 in order to recover the remaining capacity of the battery 72B that has been reduced due to dark discharge or the like when the vehicle V is stopped. At t2 to t6, the discharge performance determination section 101 conducts a discharge test in which the battery 72B is caused to discharge using the discharge circuit 202. By starting the pre-charging of the battery 72B from the activation timing t1 before an instruction for traveling of the vehicle V in the automatic driving mode is provided, it is possible to advance the starting timing of the discharge performance determination.

When it is possible to confirm that the battery 72B can discharge the predetermined amount of current through the processing of discharge performance determination, the automatic driving execution availability determination section 102 charges the battery 72B up to the target SOC using the power source circuit 71B at t6 to t10 (charging for recovery).

The automatic driving execution availability determination section 102 inhibits the automatic driving ECU 20A from executing the automatic driving control until the charging for recovery is completed at t10 after the vehicle V is activated at t1. Then, the automatic driving execution availability determination section 102 permits the automatic driving unit 20A to execute the automatic driving control at and after t10 when the discharge performance determination section 101 determines that the battery 72B can discharge the predetermined amount of current. On the other hand, the automatic driving execution availability determination section 102 inhibits the automatic driving unit 20A from executing the automatic driving when the discharge performance determination section 101 determines that the battery 72B cannot discharge the predetermined amount of current.

Also, the automatic driving execution availability determination section 102 omits the discharge performance determination using the discharge performance determination section 101 and permits the automatic driving unit 20A to execute the automatic driving control when at least any of the following omission conditions 1 to 3 is satisfied.

Omission condition 1 . . . . A first elapsed time that is an elapsed time after a timing at which it is determined that the battery 72B can discharge the predetermined amount of current in the previous discharge performance determination performed by the discharge performance determination section 101 is less than a second determination time. The first elapsed time is measured by the first elapsed time measurement section 104.

Omission condition 2 . . . . A stopping vehicle discharge amount that is the amount of discharge from the battery 72B after a timing at which a current stopping state of the vehicle V is started is less than a determination current amount. The stopping vehicle discharge amount is measured by the stopping vehicle discharge amount measurement section 106. The stopping vehicle discharge amount measurement section 106 accumulates currents discharged from the battery 72B (currents discharged through dark discharge) detected by the current sensor 200 from the timing at which the current stopping state of the vehicle V is started and calculates the stopping vehicle discharge amount.

Omission condition 3 . . . . A second elapsed time that is an elapsed time after the timing at which the current stopping state of the vehicle V is started is less than a third determination time. The second elapsed time is measured by the second elapsed time measurement section 105.

Under the aforementioned omission conditions 1 to 3, it is determined that a probability that degradation of the discharge performance of the battery 72B has occurred is low on the basis of the elapsed time after the previous normal determination (omission condition 1), the amount of discharge during stopping of the vehicle (omission condition 2), and the vehicle stopping continuation time (omission condition 3) since the degradation of the discharge performance of the battery 72B due to penetration short-circuit is caused by over-discharge of the battery 72B due to long-term leaving.

The power supply source state recognition section 103 recognizes a state of the power source 7A (corresponding to the power supply source according to the invention) by detecting an output current, an output voltage, and the like from the power source 7A using sensors, which are not illustrated in the drawing. The ECU 21B determines, as a case in which it is determined that result of the processing in S20 does not correspond to the prescribed state in S21 in FIG. 4, that the power supply source state recognition section 103 has recognized that the power source 7A cannot continue the supply of power to the control device 1A and that a situation in which the power supply source state recognition section 103 cannot recognize the state of the power source 7A has continued for the first determination time or longer. Here, reasons that the power supply source state recognition section 103 cannot recognize the state of the power source 7A include a case caused by malfunction of the sensors, a case of communication failure between the ECU 21B and the battery management ECU 26B, and the like.

4-3. Restriction of Automatic Driving Based on Discharge Performance Determination for Battery A series of processing for restricting the automatic driving based on the discharge performance determination for the battery 72B executed by the battery management unit 26B will be described in accordance with the flowchart illustrated in FIG. 8.

Figure 8:
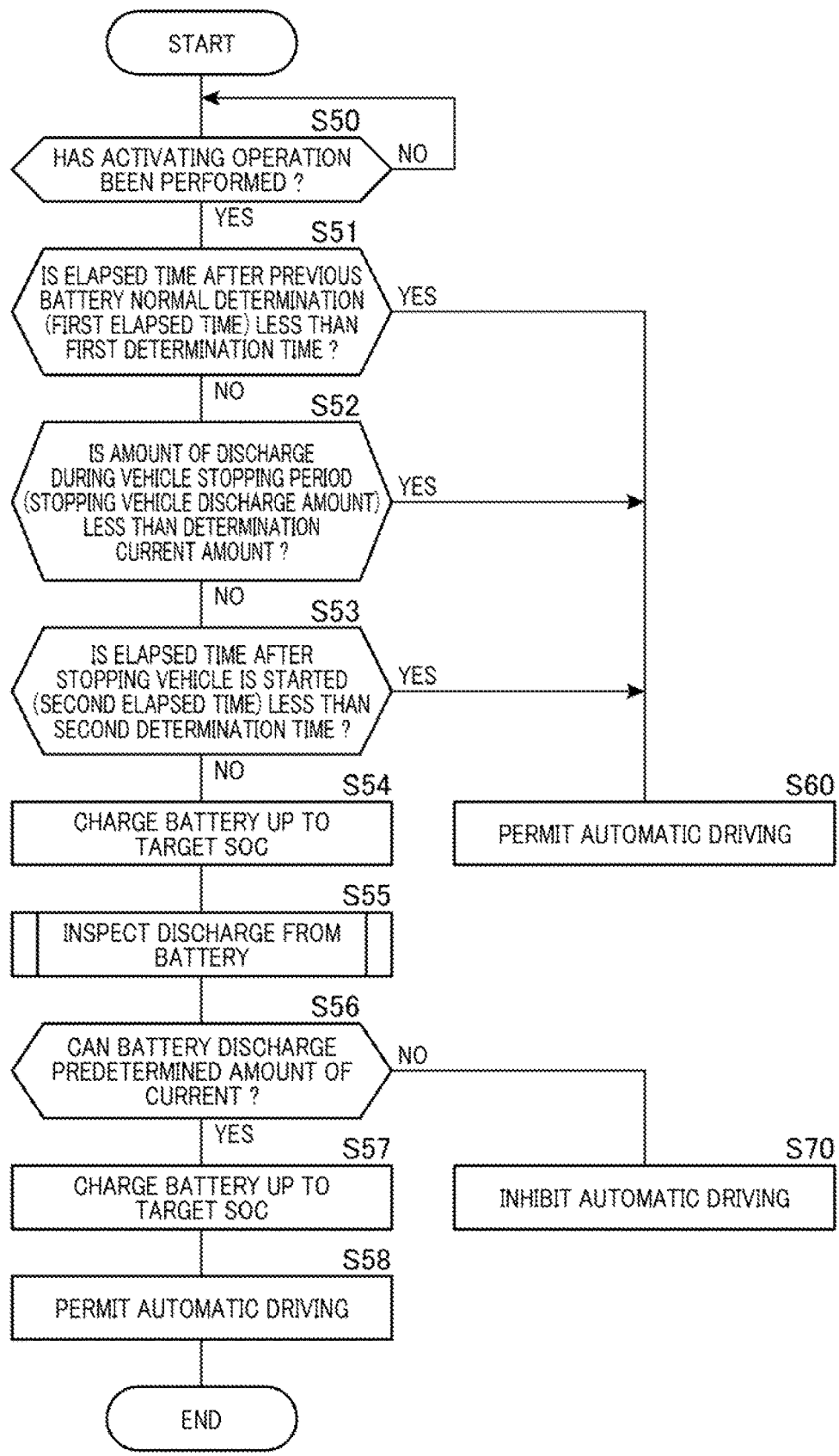
FIG. 8 is a flowchart of automatic driving restriction processing based on the determination of the discharge performance of the battery.

When the automatic driving execution availability determination section 102 recognizes an activation operation (an operation of turning on the ignition performed by the driver or the like) of the vehicle V in Step S50 in FIG. 8, processing proceeds to Step S51. In Step S51, the automatic driving execution availability determination section 102 determines whether or not the first elapsed time is less than the first determination time in accordance with the aforementioned omission condition 1.

When the first elapsed time is less than the first determination time, then the automatic driving execution availability determination section 102 moves on to the processing in Step S60, omits the discharge performance determination performed by the discharge performance determination section 101, and permits the automatic driving unit 20A to execute the automatic driving control. On the other hand, when the first elapsed time is equal to or greater than the first determination time, the automatic driving execution availability determination section 102 moves on to the processing in Step S52.

In Step S52, the automatic driving execution availability determination section 102 determines whether or not the stopping vehicle discharge amount is less than the determination current amount in accordance with the aforementioned omission condition 2. When the stopping vehicle discharge amount is less than the determination current amount, then the automatic driving execution availability determination section 102 moves on to the processing in Step S60, omits the discharge performance determination performed by the discharge performance determination section 101, and permits the automatic driving unit 20A to execute the automatic driving control. On the other hand, when the stopping vehicle discharge amount is equal to or greater than the determination current amount, the automatic driving execution availability determination section 102 moves on to the processing in Step S53.

In Step S53, the automatic driving execution availability determination section 102 determines whether or not the second elapsed time is less than the second determination time in accordance with the aforementioned omission condition 3. When the second elapsed time is less than the second determination time, then the automatic driving execution availability determination section 102 moves on to the processing in Step S60, omits the discharge performance determination performed by the discharge performance determination section 101, and permits the automatic driving unit 20A to execute the automatic driving control. On the other hand, when the second elapsed time is equal to or greater than the second determination time, the automatic driving execution availability determination section 102 moves on to the processing in Step S54.

Here, in regard to Steps S51, S52, and S53, Step S51 is preferably included and performed first. However, all Steps S51, S52, and S53 may not be included, and an order of the determination may appropriately be changed. Also, a specification in which only a step that is considered to be the most appropriate is selected among Steps S51, S52, and S53 for determination may also be employed in accordance with a state of the vehicle.

Steps S54 and S55 are processing for discharge performance determination performed by the discharge performance determination section 101. The discharge performance determination section 101 charges the battery 72B up to the target SOC (here, corresponding to the second predetermined remaining capacity according to the invention) with the power source circuit 71B in Step S54. In next Step S55, the discharge performance determination section 101 performs the discharge performance determination described above with reference to FIG. 7 and determines whether or not the battery 72B can discharge the predetermined amount of current.

In next Step S56, the automatic driving execution availability determination section 102 determines whether or not it has been determined that the battery 72B can discharge the predetermined amount of current in the discharge performance determination. When it is determined that the battery 72B can discharge the predetermined amount of current, then the automatic driving execution availability determination section 102 moves on to the processing in Step S57. In Step S57, the automatic driving execution availability determination section 102 charges the battery 72B up to the target SOC (here, corresponding to the first predetermined remaining capacity according to the invention) with the power source circuit 71B, and in next Step S58, the automatic driving execution availability determination section 102 permits the automatic driving unit 20A to execute the automatic driving control.

Meanwhile, it is determined that the battery 72B cannot discharge the predetermined amount of current, the automatic driving execution availability determination section 102 moves on to the processing in Step S70 from Step S56 and inhibits the automatic driving unit 20A from executing the automatic driving control.

5. Other Embodiments

Although the automatic driving function of the vehicle V is targeted, and the discharge performance determination section 101 determines whether or not it is possible to discharge the predetermined amount of current required to execute the vehicle stopping processing during automatic driving in the aforementioned embodiment, the determination may be made regarding whether or not a predetermined amount of current can be discharged for functions other than the automatic driving function. For example, an idling stopping function, a function of addressing non-availability of supply of power generated by a generator, or the like may be targeted, and determination may be made regarding whether or not a predetermined amount of current required for causing the functions or functions supporting the functions to act can be discharged before the functions are enabled.

Although the discharge performance determination section 101 determines the discharge performance of the battery 72B by conducting the discharge test in which the battery 72B is caused to discharge the predetermined amount of discharge in the aforementioned embodiment, the discharge performance of the battery may be determined by another method.

In the embodiment, the automatic driving execution availability determination section 102 charges (charging for recovery) the battery 72B for recovering the amount of discharge that accompanies the discharge performance determination and then permits the automatic driving control as illustrated at t6 to t10 in FIG. 7 and in Step S57 in FIG. 8. As another configuration, the automatic driving control may be permitted without performing the charging for recovery.

Although the automatic driving execution availability determination section 102 determines the aforementioned omission conditions 1 to 3 and omits the discharge performance determination in the aforementioned embodiment, a configuration in which the discharge performance determination is not omitted may also be employed. Alternatively, a configuration in which only any of the aforementioned omission conditions 1 to 3 is determined may also be employed.

The discharge performance determination section 101 starts to pre-charge the battery 72B in response to an operation of activating the vehicle V at t1 in FIG. 7 and in Steps S50 and S54 in FIG. 8 in the aforementioned embodiment. As another configuration, the pre-charging of the battery 72B may be started at a timing at which the automatic driving is selected or the like.

Although the automatic driving unit 20A executes the automatic driving control in a level that is performed in a state in which the driver releases hands from the steering wheel ST in the aforementioned embodiment, the invention can also be applied to automatic driving in another level.

Note that FIGS. 1 to 3 and 6 are outline diagrams illustrating functional configurations of the vehicle system 1 in a divided manner depending on details of main processing for easiness in understanding of the invention, and the configuration of the vehicle system 1 may be configured by in another divided manner. The processing of the respective components may be executed by one hardware unit or may be executed by a plurality of hardware units. The processing of the respective components may be executed by one program or may be executed by a plurality of programs.

REFERENCE SIGNS LIST

1 Vehicle system
1A, 1B Control device
7A, 7B Power source
20A Automatic driving unit
21B Traveling assistance unit
26B Battery management unit
72B Battery
100 CPU
101 Discharge performance determination section
102 Automatic driving execution availability determination section
103 Power supply source state recognition section
104 First elapsed time measurement section
105 Second elapsed time measurement section
106 Stopping vehicle discharge amount measurement section
200 Current sensor
201 Voltage sensor
202 Discharge circuit

What is claimed is:

1. A vehicle system that comprises a battery and a vehicle control device that uses power supplied from the battery, and controls operations of a vehicle, wherein
the vehicle control device comprises a first processor, wherein the first processor:
executes predetermined function control of causing a predetermined function of the vehicle system;
determines whether or not the battery has discharge performance capable to discharge a predetermined amount of current before executing the predetermined function control;
permits executing the predetermined function control when it is determined that the battery has the discharge performance capable to discharge the predetermined amount of current; and
inhibits executing the predetermined function control when it is determined that the battery does not have the discharge performance capable to discharge the predetermined amount of current, wherein
the first processor:
measures a stopping vehicle discharge amount that is an amount of discharge from the battery when the vehicle is stopped from a timing when the vehicle stops and an elapsed time when the vehicle is stopped from the timing when the vehicle stops,
before executing the predetermined function control, determines whether the stopping vehicle discharge amount from the timing when the vehicle stops is equal to or greater than a predetermined amount of current and the elapsed time from the timing when the vehicle stops is equal to or longer than a predetermined time, and when it is determined that the stopping vehicle discharge amount from the timing when the vehicle stops is equal to or greater than a predetermined amount of current and the elapsed time from the timing when the vehicle stops is equal to or longer than a predetermined time, pre-charges the battery to a predetermined remaining capacity of the battery in order to recover the remaining capacity of the battery that has been reduced due to dark discharge when the vehicle is stopped.

2. The vehicle system according to claim 1,
wherein the predetermined function is an automatic driving function,
the first processor is communicatively connected, via a communication line, to a second processor executing control related to driving assistance of the vehicle, and
when communication failure between the second processor and the first processor occurs, the first processor recognizes that continuation of power supply from the battery to the vehicle control device is impossible and executes vehicle stopping control.

3. The vehicle system according to claim 2,
wherein the automatic driving function includes automatic driving in a level that is performed in a state in which a driver of the vehicle releases hands from a steering wheel of the vehicle.

4. The vehicle system according to claim 1,
wherein the first processor determines whether or not the battery is able to discharge the predetermined amount of current by conducting a discharge test in which the battery is actually caused to discharge.

5. The vehicle system according to claim 4,
wherein the first processor starts to charge the battery up to a second predetermined remaining capacity when the vehicle is activated and starts to determine whether or not the battery is able to discharge the predetermined amount of current after the charging of the battery up to the second predetermined remaining capacity is completed.

6. The vehicle system according to claim 1, wherein the first processor:
measures a first elapsed time that is an elapsed time after determining that the battery is able to discharge the predetermined amount of current,
permits executing the predetermined function control without determining whether or not the battery is able to discharge the predetermined amount of current when the first elapsed time is less than a second determination time, and determines whether or not to permit executing the predetermined function control on the basis of a result of determining whether or not the battery is able to discharge the predetermined amount of current when the first elapsed time is equal to or greater than the second determination time.

7. The vehicle system according to claim 1, wherein the first processor:
permits executing the predetermined function control without determining whether or not the battery is able to discharge the predetermined amount of current when the stopping vehicle discharge amount is less than a determination current amount.

8. The vehicle system according to claim 1, wherein the first processor:
permits executing the predetermined function control without determining whether or not the battery is able to discharge the predetermined amount of current when the elapsed time from the timing when the vehicle stops is less than a third determination time.

9. The vehicle system according to claim 1,
wherein the predetermined amount of current is an amount of current required by the vehicle system to execute vehicle stopping control causing the vehicle to stop when a predetermined driving stopping condition is satisfied during traveling of the vehicle using automatic driving based on an automatic driving function, and the battery is provided in the vehicle to execute the vehicle stopping control.

* * * * *